United States Patent [19]

Roberson

[11] 3,748,543

[45] July 24, 1973

[54] HERMETICALLY SEALED SEMICONDUCTOR PACKAGE AND METHOD OF MANUFACTURE

[75] Inventor: Donald Keith Roberson, Scottsdale, Ariz.

[73] Assignee: Motorola, Inc., Franklin Park, Ill.

[22] Filed: Apr. 1, 1971

[21] Appl. No.: 130,339

[52] U.S. Cl........ 317/234 R, 317/234 G, 317/234 N

[51] Int. Cl............................................... H01l 5/02

[58] Field of Search.......................... 317/234, 4, 5.4

[56] References Cited

UNITED STATES PATENTS

| | | | |
|---|---|---|---|
| 3,404,319 | 10/1968 | Tsuji et al. | 317/234 |
| 3,189,973 | 6/1965 | Edwards et al. | 29/25.3 |
| 3,489,956 | 1/1970 | Yanai et al. | 317/234 |
| 3,320,353 | 5/1967 | Smith | 174/52 |
| 3,158,788 | 11/1964 | Last | 317/101 |

*Primary Examiner*—John W. Huckert
*Assistant Examiner*—E. Wojciechowicz
*Attorney*—Mueller & Aichele

[57] ABSTRACT

There is disclosed a hermetically sealed semiconductor package which is physically thin, allowing mounting within apertures formed in printed circuit boards which are stacked one on top of another in a high density configuration. The hermetic seal is made to a planar surface resulting in high reliability devices in which the leads to the interior of the package are made through "cross under" regions which are provided with planar top surfaces. The "cross under" region is a region of extremely low resistivity, high temperature material. Because this material is utilized as part of the lead to the device and because the hermetic seal is made on top of the "cross under," higher temperatures, which would ordinarily destroy metal leads, can be applied to the sealing material both on top of the "cross unders" and on top of the substrate for increasing the reliability of the seal.

This package replaces the more fragile prior art hermetically sealed devices which include a number of piece parts. A device packaged in the subject manner is also used as a hermetically sealed substitute for beam lead devices, since the subject devices are thin, have a higher reliability than unsealed beam lead devices and are impervious to welding and other contaminants during mounting.

15 Claims, 9 Drawing Figures

INVENTOR
Donald K. Roberson
BY
Mueller & Aichele
ATTY'S

INVENTOR
Donald K. Roberson
BY
Mueller & Aichele
ATTY'S

HERMETICALLY SEALED SEMICONDUCTOR PACKAGE AND METHOD OF MANUFACTURE

BACKGROUND

This invention relates to semiconductor packaging and more particularly to physically thin hermetically sealed semiconductor packages which require fewer manufacturing steps and piece parts than prior art devices. The subject package is used in high density packing applications and, in general, whenever a highly reliable, sealed, thin package is required.

Hermetically sealed packages, in the past have required a multiplicity of pieces or parts, including two glass sealing regions, wire bonds to lead frames sandwiched in between these regions, a fragile lid frame which must be properly aligned, and a fragile lid which must be positioned in the lid frame and sealed thereto in an additional heat treatment step. Not only are the processing steps numerous but the package obtained is relatively thick. More importantly the package is extremely fragile as well as being expensive. In the past there have been attempts to form heremetic seals by directly depositing a sealing material over the entire completed device. However, cracking occurs due to different coefficients of expansion and other incompatibilities of the materials used.

The hermetic seal is usually used to increase the reliability of conventional semiconductor devices. Beam lead devices, which achieve a higher degree of reliability than unsealed conventional semiconductor devices even though they are themselves unsealed, are unreliable because they are unsealed resulting in gold electro-plating which occurs in the presence of moisture and because they are mounted face down, preventing inspection of the in place parts. The beam lead devices are however physically thin permitting high density packing.

The subject device is both hermetically sealed and physically thin. It is therefore more reliable than beam lead devices. In one embodiment these advantages are achieved because of a "cross under" type contact structure which permits connection of the active device interior to the sealed portion of the package to contacts exterior to the sealed portion of the package. The "cross under" is a diffused highly doped semiconductor region located in and isolated from a polycrystalline substrate. The region is so highly doped that it acts much like metal. Metallization in the form of a strip or a lead is provided from one portion of an active device diffused into the substrate to one side of the "cross under" region. A further strip or lead is provided from the other side of the "cross under" to a contact pad external to the sealed device. The top portion of the "cross under" is planar and substantially flush with the top surface of the substrate, permitting the sealing material encircling the active device to be deposited on a planar surface. This enables a virtually negligible amount of sealing material to be used so to limit the thickness of the package while maintaining a high quality seal. Thus the leads from the exterior of the package to the interiorly contained active device do not interrupt the planar sealing surface. In an alternate embodiment "cross unders" are eliminated and replaced with a continuous metal strip only 10,000 angstroms in thickness. These can be used when high temperature sealing glasses are not required. A silicon lid is then positioned over the sealing material and the device is heated to effect the seal. If the device is heated only in the areas occupied by the sealing material, higher sealing temperatures can be used. In the "cross under case" these temperatures can exceed those which would normally destroy the metallization because the "cross under" contains none of this metal and does not itself melt. Thus better hermetic seals can be formed because of the high temperature treatment now made possible and the planarization of the two sealing surfaces.

As mentioned before, if high temperature hermetic sealing is not critical, the "cross under" can be eliminated and contact made to the active device via continuous metallization between the contact pad, through the seal and to the active device, since the metallization thickness is typically 10,000 angstroms thick.

The contact pads to the subject device are not left floating as in the prior art, but are rather deposited on a projection of the passivated substrate extending from the hermetically sealed area. The replacement of the conventional ceramic substrate and lid with a semiconductor substrate and lid permits monolithic fabrication of the hermetically sealed device. This not only adds mechanical stability and reliability to the completed device, but also reduces the number of fragile piece parts and the handling problems associated therewith. It will also be noted that semiconductor materials are smoother than ceramics. This permits an even tighter seal.

It will further be appreciated that all sealing is accomplished while the device is in wafer form. Since the same semiconductor material is used as both the substrate and the lid, the substantially matched coefficients of expansion of the substrate and the lid prevent cracking or fracture of the device during temperature swings.

The entire package can be made to less than a 15 mil thickness thereby providing for the aforementioned high density packing. This is because thin metallization layers are used instead of lead frames and because only small amounts of sealing materials are necessary. The thinness of the package is important in small high reliability computers in which upwards of 1500 integrated circuits must be compacted into 45 cubic inches of space.

SUMMARY OF THE INVENTION

It is therefore an object of this invention to provide an improved hermetically sealed and thin semiconductor package.

It is a further object of this invention to provide an improved combination of circuit board mounting means and an improved hermetically sealed semiconductor package in which the package width and quality of the seal permit high density, high reliability, packing of integrated circuits.

It is another object of this invention to provide a substantially planar surface so as to effect an improved hermetic seal by providing a conducting region in the substrate of the device under the seal which is flush with the top of the substrate and which is capable of withstanding the heats of formation of the seal.

It is yet another object of this invention to provide a hermetically sealed package in which the leads to the active device are metallized strips over part of which is formed the sealing material which also surrounds the active device, and which is further provided with a lid over the sealing material.

It is a still further object of this invention to provide an improved hermetically sealed semiconductor device in which the device is fabricated in monolithic form with the seal being applied to a planar portion of the top surface of the monolithic wafer.

It is a still further object of this invention to provide an improved method of fabricating a hermetically sealed semiconductor device.

These and other objects and features of this invention will become more fully apparent from the following description of the accompanying drawings.

BRIEF DESCRIPTION OF THE INVENTION

There is disclosed a hermetically sealed semiconductor package which is physically thin, allowing mounting within apertures formed in printed circuit boards which are stacked one on top of another in a high density configuration. The hermetic seal is made to a planar surface resulting in high reliability devices in which the leads to the interior of the package are made through "cross under" regions which are provided with planar top surfaces. The "cross under" region is a region of extremely low resistivity high temperature material. Because this material is utilized as part of the lead for the device and because the hermetic seal is made on top of the "cross under," higher temperatures, which would ordinarily destroy metal leads, can be applied to the sealing material both on top of the "cross under" and on top of the substrate for increasing the reliability of the seal.

This package replaces the more fragile prior art hermetically sealed devices which include a number of piece parts. A device packaged according to the teachings of this invention is also used as a hermetically sealed substitute for beam lead devices, since the subject devices are thin, have a higher reliability than the unsealed beam lead devices, and are impervious to welding and other contaminants during mounting. The physical thinness of the package as well as the choice of materials utilized in the hermetic sealing operation permit the use of these devices in radiation hardened applications.

DETAILED DESCRIPTION OF THE INVENTION

Figure 1:
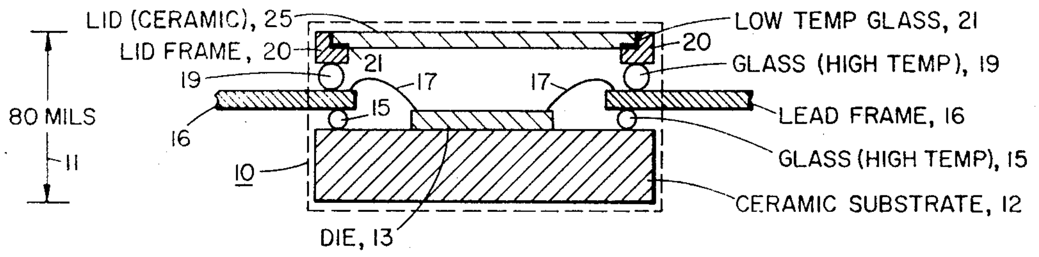
Fig. 1 PRIOR ART
FIG. 1 is a cross sectional diagram of a conventional hermetically sealed package showing the multiplicity of piece parts involved in the fabrication of the package.

Referring to FIG. 1 a conventional hermetically sealed package is shown in dotted outline by the reference character 10. As shown by the arrow 11 the package 10 is usually 80 mils thick. In general the package 10 consists of a ceramic substrate, 12 onto which is bonded a semiconductor die 13 carrying any number of integrated circuit components (not shown). Adjacent the die 13 is glass sealing material 15 in contact with the substrate 12 and those portions of lead frames 16 which rest on the glass material 15. Wires or leads 17 are connected from selected areas on the die 13 to the ends of the lead frames 16 as shown, thus requiring a separate wire bonding step in the fabrication of the device. Additional glass sealing material 19 is placed on top of the lead frames as shown. Materials 15 and 19 are high temperature glasses referring to the fact that these glasses melt at approximately 800°–900° C. Heating these glasses to above 800° C would destroy most metallization layers especially if they are made of copper or aluminum. Prior to heating a lid frame 20 is placed on top of the glass material 19 and the entire device, absent the die 13 and wires 17, is heated so as to form a seal between the lid frame 20 and the substrate 12.

Figure 2:
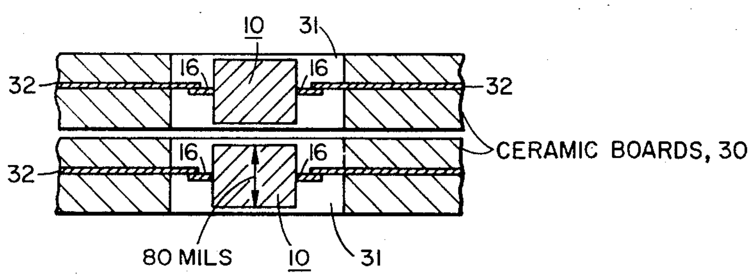
Fig. 2 PRIOR ART
FIG. 2 is a diagram showing the stacking of circuit boards containing conventional hermetically sealed packages.

Thereafter the die 13 is inserted through the open lid frame and is bonded to the substrate 12. The aforementioned wires 17 are then bonded between the die 13 and the lead frame 16. After this series of steps a low temperature sealing glass 21 is deposited on the lid frame 20 as shown. This glass melts at a substantially lower temperature (400° C) than the glass materials 15 and 19. Thereafter a lid 25 is positioned in the lid frame 20 and the device is again heated to create a seal between the lid 25 and the lid frame 20. Although the lid is a ceramic, as is the substrate 12, and the lid frame 20, temperature swings cause stressing and cracking of the device due to the different coefficients of expansion of the ceramic, the glasses used and especially the metals of the lead frame. The device thus formed is both thick and fragile due to the fragility of the "piece parts" represented by structures 13, 15, 16, 17, 19, 20 and 25. This process also involves critical part registration problems in addition to all the problems associated with wire bonding and the different coefficients of expansion. These prior art devices are often mounted in printed circuit boards 30 as shown in FIG. 2. In order to accommodate these hermetically sealed devices 10 in the apertures 31 provided, the circuit boards themselves must exceed 80 mils in thickness. As can be seen these devices are mounted in the circuit board by soldering or welding the ends of the lead frames 16 to metallic projections on metal layers 32 runing through the multilayered circuit boards 30. It will be appreciated that the lead frames 16 are free floating, and because of this, can lead to stressing of the device 10 due to mechanical vibration of the circuit board.

Figure 3:
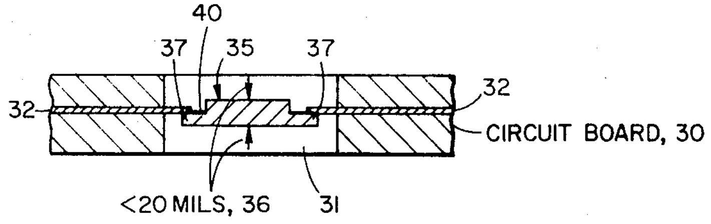
FIG. 3 shows the positioning of the subject package in a circuit board indicating the relative thinness of the subject package as compared to the standard circuit board pictured in this Figure and in FIG. 2.

The subject device, shown at 35 in FIG. 3, has a thickness of less than 20 mils as shown by arrow 36. This permits the use of circuit boards of somewhat less than 20 mils in thickness as compared with 80 mils in the prior art, thus permitting higher density stacking of components. In addition, since the subject device 35 is provided with contact pads 40 secured to projections 37 of the substrate, when the pads are welded or soldered to the projections of the metal layers 32 the combined mounting shown in FIG. 3 provides increased mechanical stability and reliability.

Figure 4:
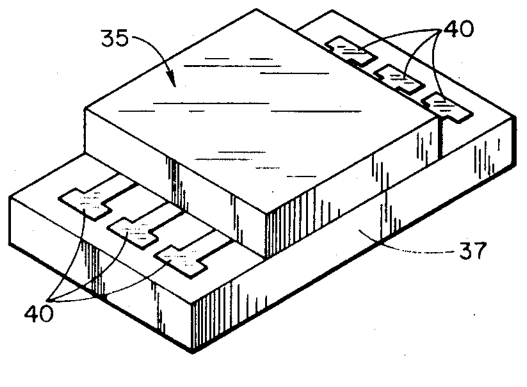
FIG. 4 is an isometric diagrammatic view of the completed package made according to the teachings of this invention showing connecting pads on projections of the substrate to enhance the mechanical stability of the package.

The completed device 35 is shown in isometric projection in FIG. 4 to include the aforementioned pads, 40, on top of projections 37. It is this structure which is inserted upwardly into the aperture 31 of the circuit board 30 as shown in FIG. 3. It will be appreciated that the completed hermetically sealed device 35 could have as many as 100 pads or connections or more to the integrated circuit components carried by the substrate. All of these connections are visible in the "face-up" mounting method shown in FIG. 3, thus allowing visual inspection of the contacts to the device from the top of the circuit board. The entire device can thus be inspected from the top of the circuit board. This is unlike the beam lead devices which are flipped over and mounted face-down so that the active part of the circuit cannot be inspected. The disadvantage of this "flip-chip" approach is apparent because of contaminants and splashing of contact metal during welding or soldering which may short out the entire device. In face-up configurations visual inspection prevents such elements from being used. The problems with the beam lead devices arise because the beam lead devices are not hermetically sealed. The reason for their use at all is their thinness which allows high density packing and their increased reliability over conventional unsealed chip-mounted circuits.

Not only is the subject device thin, it is more reliable than either hermetically sealed chips or unsealed beam lead devices because of the method of fabrication now described in connection with FIG. 5.

As mentioned hereinbefore the generic concept involved in this invention centers around the sealing of a monolithic structure by providing a planar or near planar surface on the top of the monolithic structure along the areas at which the seal is made. Normally, the leads to a monolithic device are in the form of wires as in FIG. 1. Either the wire or a lead frame must pass through the hermetic seal in order to connect the device. Since the wire or the lead frame has substantial thickness, the seal must be made to a surface made non-planar by the wire or lead frame.

Figure 5:
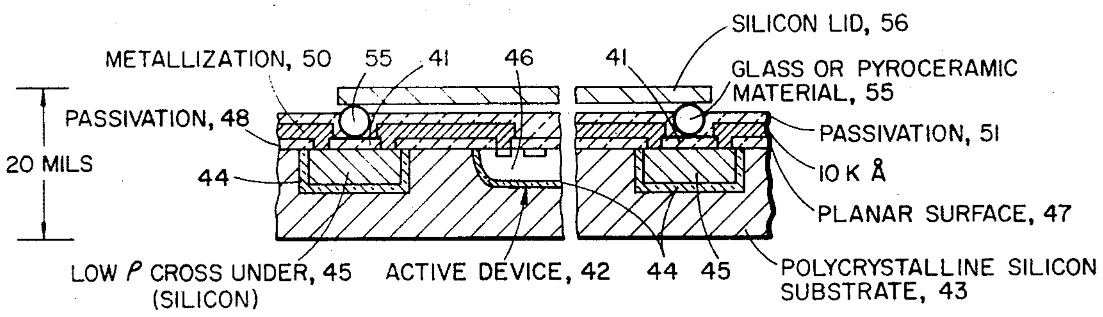
FIG. 5 is a detailed cross-sectional view of a portion of the device shown in FIG. 4.
Figure 6:
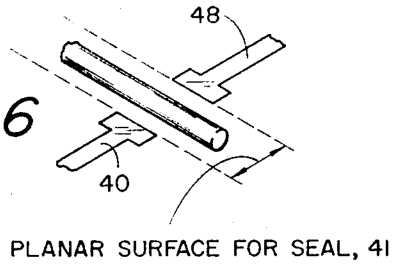
FIG. 6 is a drawing indicating the portion of the surface of the device which is to be planar in order to effect an extremely reliable seal.

As shown in FIG. 5 and more specifically in FIG. 6, a planar surface area 41 is provided as follows. A monocrystalline wafer 45 is patterned and etched at the spaces between those regions which will become "cross unders" and islands or tubs for active devices. Thereafter, a dielectric layer 44 is deposited on the etched surfaces and the non-etched surfaces on the etched side of the wafer 45. Using conventional epitaxial deposition, polycrystalline material is deposited on top of the dielectric. This polycrystalline material becomes the substrate 43 of FIG. 5. The thickness of the polycrystalline material is only that necessary for mechanical support of the finished package. In one embodiment this thickness is 10 mils. Thereafter, the other side of the monocrystalline wafer is lapped down to expose portions of the substrate 43. This results in monocrystalline regions 45 and 46 being formed in the polycrystalline substrate 43 and isolated therefrom by what remains of the oxide layer 44. Thereafter a passivation layer 48 is deposited on top of the substrate at surface 47. In one embodiment, this passivation layer is opened up over the "cross under" regions 45 so as to permit heavy doping of these regions. Alternatively the "cross under" regions can be opened up along with the diffusion of the integrated circuit components into the monocrystalline tub 46. Thus both the integrated circuit components and the "cross unders" are simultaneously doped. The monocrystalline material in the "cross under" is initially of a low resistivity of $<5\Omega$/square. The final doping concentration in the "cross under" region is on the order of $10^{21}$ atoms/$cm^3$ making the highly doped monocrystalline material like a metal. It will be appreciated that although silicon is preferred for the substrate, the "cross under" and the lid due to matched expansion coefficients and the ease of forming a dielectric thereon, other semiconductor materials having matched coefficients and and compatible dielectric layers can be used. Certain high temperature metals can be used for the "cross under" as well as any low resistivity material having a high temperature melting point. The substrate can in addition be made from spinels or even $Al_2O_3$. The lid, to be described herein-after, can be ceramic semiconductive or metallic depending on the requisite expansion characteristics.

At all times the top surface 47 of the monolithic structure is kept planar. Semiconductive material is preferred as the substrate material and for the "cross under" because it is flatter than ceramic materials.

Figure 7:
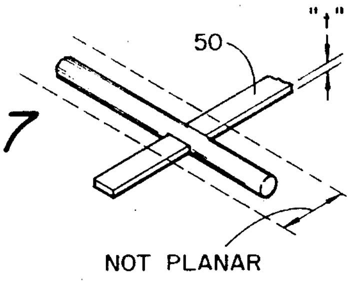
FIG. 7 shows a seal effected when a "cross under" section is not used.
Figure 8:
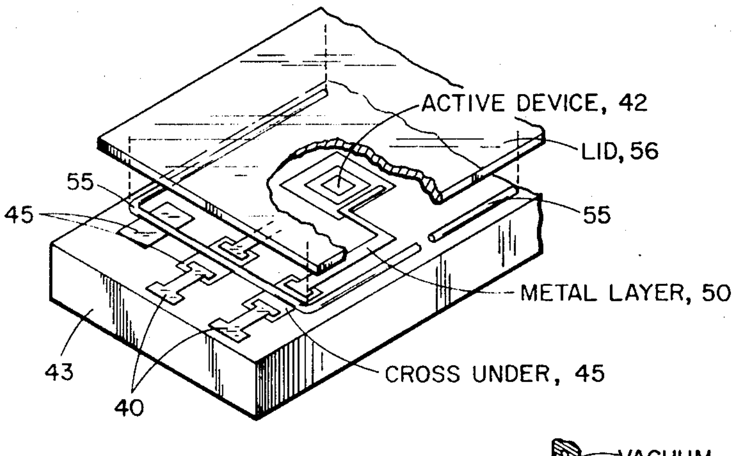
FIG. 8 is a diagram indicating the position of the sealing material and the positioning of the lid over top of the device.

Referring to FIG. 5, a metal layer 50 is then deposited over the layer 48 and is patterned. This layer runs between one side of each "cross under" region 45 and a corresponding portion of the active device 42. The metal layer starts again at the other side of each "cross under" and runs to a corresponding pad. Any metal which will coat the layer 48 may be utilized although aluminum or copper is preferred. The thickness of the layer 50 is limited so as to limit the thickness of the completed device. It will be appreciated that the layer 50 may be made to any desired thickness to handle the currents involved and that the thickness of this layer is not critical with respect to the hermetic seal because no portion of the seal contacts the layer 50 in the embodiment shown in FIGS. 5, 6 and 8. As shown in FIG. 7, where the quality of the hermetic seal is not so important the "cross under" can be eliminated and the seal run right across the patterned metal layer 50 since the thickness of deposited metal layer is minimal as compared to the thickness of prior art device lead frames. In one configuration the metal layer 50 has a thickness of 10,000 angstroms.

After the metal layer 50 has been patterned an optional deposited layer of glass passivation layer 51 may be used on top of the metal layer to protect it from scratching, scoring or peeling. Layers 48, 50 and 51 are in the 10,000 angstrom range to limit total device thickness.

If the passivation layer 51 is used it is etched so as to expose the surface of the layer 48 above the "cross under" regions 45. Thereafter a highly defined region 55 of sealing material is deposited so as to encircle the active device 42, crossing the leads from the active device 42 at the passivation layer over "cross under" regions. The seal also crosses over a portion of the passivation layer on the substrate. Since the passivation layer is planar and since the tops of the "cross unders" are flush with the top of the substrate, the seal is to a flush planar surface encircling the active device 42. This highly defined region 55 is better shown in FIG. 8. Here can be clearly seen the relationship of the sealing material 55 to the "cross under" regions 45, the contact pads 40 and the active device 42. The sealing material in the high temperature configuration is a vanadium rich glass with ferric oxide dispersed therethrough to permit rapid heating by infrared sources due to the preferential absorption of the iron to infrared radiation. In low temperature configurations a conventional pyrolytic glass is used.

Referring back to FIG. 5, a lid 56 of the same material as the substrate is placed over the sealing material and the entire device heated until the sealing material devitrifies. Alternately, only the portion of the device in the region of the sealing material is heated by the aforementioned preferential absorption technique until the sealing material melts. The reason for this latter step is to prevent vaporization of the metal layer 50 during sealing when high temperatures are used. It will be appreciated that other methods of directly or preferentially melting the sealing material, such as high voltage melting, may be used and all such methods are deemed to be within the scope of this invention.

The mating of the lid 56 to the sealing material 55 is not critical and the lid may be oversized to prevent alignment problems.

Figure 9:
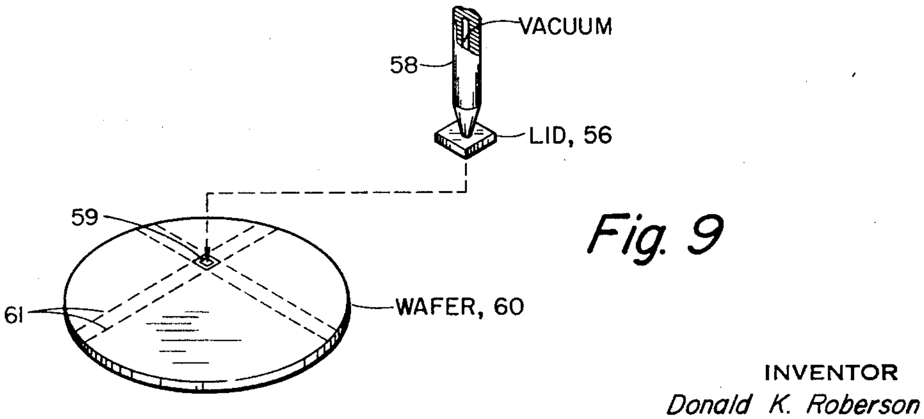
FIG. 9 is a diagram showing means for positioning the lid and the subsequent scribing of the device from the wafer.

As shown in FIG. 9, in one embodiment, the lid 56, after having been cut, is transported to its rest position on top of one of the devices 59 by means of a suction needle 58. After all lids have been positioned on all of the devices on a given wafer 60 and have been sealed to their respective devices, the wafer 60 is scribed or sawed along lines 61 so that the individual hermetically sealed devices can be separated. After they are separated they may be picked up by vacuum needles which now will not touch any active area or metal area other than an exposed pad. This latter contingency is not critical because pad bonding will correct any scoring of the pad during transport.

In the preferred embodiment the substrate is polycrystalline silicon having a thickness of 5–15 mils. The "cross unders" are monocrystalline silicon doped to $10^{21}$ atoms/$cm^3$. Layers 44, 48 and 51 are of silicon dioxide in 10,000 angstroms thicknesses. The metallization is aluminum and the sealing material is either the vanadium rich glass or a pyroceramic material in the minutest of quantities deposited preferably by a silk screening process. The lid in the preferred embodiment is silicon of a 5–10 mils thickness.

The temperatures necessary to devitrify the sealing material in the preferred embodiment are given by the following table:

TABLE I

| Sealing Material | Temperature | Time |
|---|---|---|
| Pyrolytic Glass | 350–500° C | ≈2 hours (depending on lead content) |
| Vanadium Rich Glass | 400°C | 6 seconds Preheat |
| | 700°C | 6 seconds Seal |
| | 400°C | 6 seconds cool down |

The infrared absorbing vanadium rich glass mentioned hereinbefore is a product of Owens-Illinois designated ECV 1016 which contains no ferric oxide.

Alternately the infrared absorbing glass can be a vana-dium rich glass including ferric oxide as mentioned above to give the glass the infrared absorbing characteristic.

The pyrolytic glass mentioned above is generically a low temperature recrystallizing glass having approximately 76 percent lead oxide with the remaining constituents being $B_2O_3$, ZnO, $Al_2O_3$ and $SiO_2$. This glass is commercially available under the Corning Glass trademark "pyroceram" and can be purchased in varieties ranging in melting points from 700°–400° C.

Thus is produced a thin hermetically sealed integrated circuit package, which is both thin and durable. All expensive, time consuming and critical steps necessary to fabricate "piece-part" hermetically sealed devices are eliminated in the subject process, yielding a device which supplants the use of beam lead devices and other hermetically sealed chips.

What is claimed is:

1. A minute, hermetically sealed semiconductor package having an active semiconductor device and comprising:

a substrate surrounding and abutting against all but one surface of the active semiconductor device and having a planar top surface;

a dielectric layer insulating the active semiconductor device from said substrate;

"cross under" regions within said substrate, and in spaced adjacency to said active semiconductor device, said "cross under" regions being of a low resistivity, high melting point material, and having planar top surfaces flush with the planar top surface of said substrate, the planar top surfaces of said "cross under" regions and said substrate serving to permit hermetic seals overtop thereof;

a dielectric layer insulating said "cross under" regions from said substrate;

a passivation layer over the top surfaces of said substrate and said "cross under" regions, said passivation layer having a planar top surface and said passivation layer having appertures therethrough over preselected elements in said active semiconductor device and over portions of the surfaces of said "cross under" regions so as to leave other portions of said "cross under" regions covered by said passivation layer;

a layer of conductive material over said passivation layer and patterned so as to connect selected elements in said active device to first sides of selected "cross under" regions, and so as to form contact pads secured to said substrate and connected to second sides of said "cross under" regions, said conductive material contacting said active elements and said "cross under" regions by extending into said apertures, said conductive material being further patterned to expose the passivation layer over said other portions of said "cross under" regions;

a region of sealing material surrounding said active device and forming a continuous path over the planar top surface of said passivation layer, said sealing material crossing said "cross under" regions over the planar top surface of the passivation layer extending over said other portions;

a lid of a material having a similar thermal coefficient of expansion to that of said substrate positioned over said sealing material and enclosing the area circumscribed by said sealing material but leaving portions of said contact pads exposed, said lid being sealed to the planar top surface of said passivation layer and thereby to the top surfaces of said "cross under" regions and said substrate by the application of heat sufficient to seal said sealing material.

2. The package as recited in claim 1 wherein said substrate is polycrystalline silicon, said lid is monocrystalline silicon and said sealing material is infrared absorbing vanadium rich glass.

3. The package as recited in claim 2 wherein said vanadium rich glass includes a quantity of ferric oxide.

4. The package as recited in claim 1 and further including a second passivation layer on top of the layer of conductive material over said first mentioned passivation layer, said second passivation layer being provided with apertures therethrough at said contact pads, and at said other portions of said "cross under" regions thereby permitting sealing material to project through said second passivation layer to contact said first passivation layer.

5. The package as recited in claim 1 wherein said low resistivity high melting point material forming said "cross under" regions is a highly doped semiconductor material.

6. The package as recited in claim 5 wherein said semiconductor material is silicon having a doping concentration in excess of $10^{20}$ atoms/cm$^3$.

7. The package as recited in claim 1 wherein said "cross under" regions are formed by etching out regions in a body of said low resistivity material in areas adjacent the position where said low resistivity material is to be located, covering the surface of said body which has been etched with a layer of dielectric material, forming said substrate on top of said dielectric layer and lapping said body down to the portion of said substrate extending into said etched regions such that a channel of said low resistivity material is formed having a top surface flush with that portion of the substrate exposed due to said lapping.

8. The package as recited in claim 1 wherein said dielectric layers are comprised of silicon dioxide.

9. The package as recited in claim 1 wherein said "cross under" regions are of a moderately doped semiconductor material which is further doped by the dopant used in forming the active device in said substrate, said "cross under" regions being doped simultaneously with the formation of said active device.

10. The package as recited in claim 1 wherein said sealing material is a low temperature recrystallizing glass.

11. The package as recited in claim 1 and further including a multilayered circuit board having an aperture therethrough corresponding in size to the outside dimensions of said package, said circuit board having a metal strip therethrough with an end portion extending into said aperture, the end portion of said strip extending into said aperture corresponding in position to the location of a contact pad on said substrate when said package is in place in said circuit board, such that said contact pad may be welded to said portion thereby to connect an element in said active device to said strip whereby the mechanical stability of the package in the circuit board is increased due to the mechanical stability of said substrate and the contact pads thereon.

12. A method of manufacturing a plurality of semiconductor devices including the steps of:

providing a body of semiconductive material having a surface which is substantially planar;

selectively etching selected areas of said planar surface of said body of semiconductive material;

covering the unetched areas of said surface and the etched areas with a dielectric material;

forming a substrate on the outwardly facing surface of said dielectric material;

removing portions of said body of semiconductive material to leave the unetched regions of said semiconductive body partially embedded in and insulated from said substrate;

forming a plurality of active semiconductor components in some of said insulated regions of semiconductive material and a plurality of conductors in other of said regions;

placing a passivation layer over selected areas of the outwardly facing surfaces of said active semiconductor components and conductors;

forming a layer of conductive material over said passivation layer and over some of the exposed areas of said semiconductor components and conductors to provide electrical interconnection between said semiconductor components and said conductors and to provide contacting pads extending from said conductors;

sealing surfaces of lids over said passivation layer such that the edge regions thereof cross over said conductors at areas covered by said passivation layer so that said conductive material does not extend beneath said edge regions of said lids enclosing said active semiconductor components but leaving said contacting pads exposed; and separating selected areas of said substrate which each include an active semiconductor device and at least one of said conductors to thereby provide the plurality of completed semiconductor devices.

13. The method as recited in claim 12 wherein said plurality of active semiconductor components and said plurality of conductors are formed by diffusions.

14. An integrated circuit device comprising:

a plurality of semiconductor regions supported by a substrate, selected ones of said regions at the periphery of said substrate having diffused regions comprising conductive cross unders, each of said cross unders having first and second end portions and intermediate portions between said first and second end portions, another of said semiconductor regions in the central portion of said substrate comprising an active semiconductor device having elements;

first conductive material connecting said elements of said semiconductor device to said first ends of said cross unders;

a lid sealed to said surface of said substrate at intermediate portions of said cross unders and overlying said active semiconductor device; and second conductive material connected to said second portions of said cross unders and located outside of said lid.

15. The integrated circuit of claim 14 wherein said second conductive material forms contact pads located on and connected to the surface of said substrate.

* * * * *